US006853220B2

(12) United States Patent
De Laurentiis et al.

(10) Patent No.: US 6,853,220 B2
(45) Date of Patent: Feb. 8, 2005

(54) METHOD AND AMPLIFICATION CIRCUIT WITH PRE-EMPHASIS

(75) Inventors: Pierpaolo De Laurentiis, Milan (IT); Luciano Tomasini, Monza (IT); Claudio Cattaneo, Colle Brianza (IT)

(73) Assignee: STMicroelectronics S.r.l., Agarte Brianza (IT)

( * ) Notice: Subject to any disclaimer, the term of this patent is extended or adjusted under 35 U.S.C. 154(b) by 0 days.

(21) Appl. No.: 10/679,943

(22) Filed: Oct. 6, 2003

(65) Prior Publication Data

US 2004/0124891 A1 Jul. 1, 2004

(30) Foreign Application Priority Data

Oct. 4, 2002 (IT) .................................... VA2002A0050

(51) Int. Cl.[7] ............................ H03B 1/00; G01R 19/00
(52) U.S. Cl. ......................................... 327/108; 327/52
(58) Field of Search ................................ 327/108, 112, 327/52, 57, 65, 69, 81–82, 85, 89, 261, 266, 274, 561–563; 326/81–83, 85–87; 330/252–254, 277–278

(56) References Cited

U.S. PATENT DOCUMENTS 5,739,707 A * 4/1998 Barraclough ................ 327/112
6,535,019 B2 * 3/2003 De Santis .................... 326/83
6,542,144 B2 * 4/2003 Kogure et al. ................ 345/98
6,566,911 B1 * 5/2003 Moyer ......................... 326/83
6,590,432 B1 * 7/2003 Wu et al. ................... 327/108

* cited by examiner

*Primary Examiner*—My-Trang Nu Ton
(74) *Attorney, Agent, or Firm*—Lisa K. Jorgenson; Allen, Dyer, Doppelt, Milbrath & Gilchrist, P.A.

(57) ABSTRACT

A method for amplifying a digital signal representative of data to be transmitted by a line driver with pre-emphasis over an output line is provided. The gain of the line driver is varied between an upper value to coincide with switching of the digital signal and a lower value in absence of the digital signal switching. In particular, the varying includes amplifying the digital signal with a first gain for generating an amplified digital signal, delaying the digital signal with a predetermined delay for generating a delayed digital signal, and amplifying the delayed digital signal with a second gain for generating a delayed and amplified digital signal. An ouput signal corresponding to a difference between the amplified digital signal and the delayed and amplified digital signal is output over the output line.

22 Claims, 3 Drawing Sheets

METHOD AND AMPLIFICATION CIRCUIT WITH PRE-EMPHASIS

FIELD OF THE INVENTION

The present invention relates in general to output stages of electronic circuits, and in particular, to an amplification circuit with pre-emphasis.

BACKGROUND OF THE INVENTION

In the majority of electronic systems, speed is a fundamental parameter among the parameters that determine the global performance of an electronic system. As far as the so-called "system on chip" is concerned, the handling of off-chip electrical signals is more critical and poses more problems than the handling of on-chip signals.

The need of reliably achieving very high communication frequencies has led to the abandonment of CMOS full-swing signals (that is, signals that vary from the negative voltage supply Vss to the positive voltage supply Vdd). This was motivated by the difficulty of outputting signals of extremely high frequency, especially when they are to be conveyed over a long conduction line of a printed circuit board and/or over a long cable having a low matching impedance.

The step forward was to produce differential output signals onto matched lines, using a reduced standard output swing of only 350 mV per signal. Thus, it has become possible to transfer data at enhanced speeds, reducing interferences and power consumption, and at the same time, improving common mode noise rejection. An example of this technique is the standard low voltage differential signals (LVDS). FIG. 1 depicts a basic diagram of an LVDS standard cell, the functioning of which is well known.

Upon increasing the frequency beyond 1 GHz another problem becomes relevant. Because of the skin effect in conductors, the resistance thereof increases according to a non-linear law as a function of the frequency. This causes a non-linear attenuation as the frequency increases.

In addition, manufacturers of telecommunication systems often tend to continue to use old design boards, updating only the electronic components and/or to employ low quality materials for lowering the cost of printed circuit boards. This may cause significant attenuations due to poor dielectrics as the frequency increases.

To alleviate these degrading effects, two techniques have been developed that may be used alone or in combination with each other. These two techniques are adaptive equalization of the line and pre-emphasis of the signal to be transmitted.

The first technique uses a stage in which the gain varies with frequency to compensate for attenuation along the transmission line. The article by J. Y. Sim et al. "A CMOS Transceiver For DRAM Bus System With A Demultiplexed Equalization Scheme", *IEEE J. Solid-State Circuits*, vol. 37, pp. 245–250, February 2002, describes an equalized transceiver that uses a particular equalization system for reducing inter-symbolic interference. Adaptive equalization, besides requiring more complex circuits, reduces the signal/noise ratio.

In contrast, the pre-emphasis technique varies the spectral content of the transmitted signal to obtain a transfer function of the cascade of the pre-emphasis network and of the transmission line that is almost constant with the frequency in the band of interest. When the line attenuation is relatively small, a pre-emphasis amplification is sufficient only during or even immediately after the switching transients of the signals to be output.

U.S. Pat. No. 6,288,581 to Wong and U.S. Pat. No. 6,281,715 to DeClue et al. disclose LVDS drivers with pre-emphasis. These circuits amplify a digital signal to be transmitted with an enhanced gain coinciding with the switching of the signal compared to the gain during the phases in which the signal maintains a constant value.

In particular, the '581 patent discloses a LVDS driver with pre-emphasis having two standard LVDS cells, as shown in FIG. 2. The LVDS driver includes enabling transistors 44, 54 and 24, 34 and the output nodes of which are connected through switches 60 and 62. When the signal to be transmitted remains constant, the output differential signal VOP, VON is generated only by one LVDS cell. When the signal represented by the differential pair V+, V− is applied to transmit the switches, the switches 60 and 62 are closed and remain in a conduction state as long as the transient lasts. This results in the two LVDS cells generating the output differential signal VOP, VON.

This technique has the drawback of requiring a good synchronization of the turning on of switches 60 and 62 with the switching edges of the signal to be transmitted. This is complicated because of the turn-on delays of the switches.

The '715 patent discloses a single stage driver with pre-emphasis having two current mirrors, wherein one always biases the output stage while the other is operatively connected only when the relative control circuit detects a switching of the signal to be transmitted. In this second case, the problem is to synchronize the turning on of the second current mirror with the switching edges of the signal to be transmitted. Consequently, this limits the transmission speed.

SUMMARY OF THE INVENTION

In view of the foregoing background, an object of the present invention is to provide a method and corresponding amplification circuit for amplifying with pre-emphasis to overcome the above mentioned synchronization problems, and to improve the performance of circuits implementing pre-emphasis techniques.

A main feature of the present invention is to increase the gain at each switching edge of the signal to be transmitted by using a driver with pre-emphasis that combines the signal to be transmitted with a delayed replica thereof. The driver does not have any sub-circuits to be connected and disconnected at each switching of the signal to be transmitted.

More precisely, an object of the present invention is to provide a method for amplifying with pre-emphasis a digital signal representing data to be transmitted through a line driver with pre-emphasis. The gain may vary from a pre-established upper value to a lower value, as well as varying the other way around. The method comprises varying the gain of the line driver with pre-emphasis by setting it at its upper value when coinciding with each switching of the digital signal, and reducing it to its lower value in absence of switching of the digital signal.

The method of the invention addresses the above discussed synchronization problems of the known methods because the variation of the gain is performed through a number of steps. These steps include amplifying the digital signal with a first gain for generating an amplified replica signal, and delaying the digital signal by a certain pre-established time and generating a delayed replica signal.

The delayed replica signal may be amplified with a second gain for generating a delayed and amplified replica signal. The output signal may be produced as a difference between the amplified replica signal and the delayed and amplified replica signal. The method of the invention is implemented by an amplification circuit with pre-emphasis, preferably for transmitting signals according to the LVDS standard technique.

BRIEF DESCRIPTION OF THE DRAWINGS

The different aspects and advantages of the present invention will become even more evident through a detailed description referring to the attached drawings, wherein.

DETAILED DESCRIPTION OF THE PREFERRED EMBODIMENTS

Figure 3:
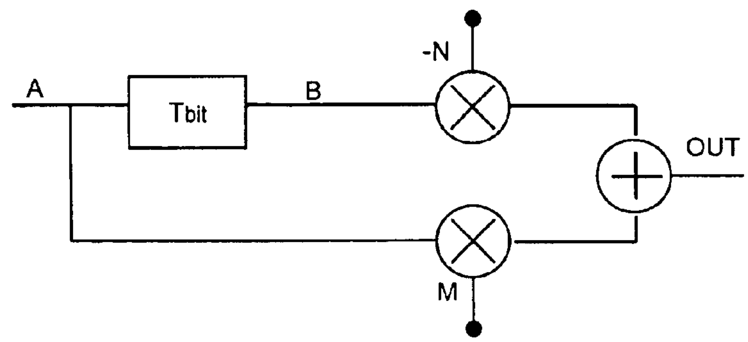
FIG. 3 depicts a basic diagram of the amplification circuit with pre-emphasis according to the present invention.

An advantageous feature of the present invention includes generating the amplified digital signal that is transmitted over an output line as the weighted algebraic sum of the input digital signal to be transmitted and a delayed replica thereof. Referring now to FIG. 3, a basic diagram of the amplification circuit with pre-emphasis in accordance with the present invention is shown. The label A indicates the digital signal to be transmitted, and the label OUT is the output signal that may be either a full-swing or a LVDS signal. The output signal OUT is the difference signal between an amplified replica with a certain gain M of the signal A to be transmitted, and an amplified replica with a certain gain N smaller than M, of a delayed replica B of the signal A.

The novel architecture of the present invention does not require sub-circuits to be switched in or out of the functional amplifying circuit at each transition of the signal A. The digital signal A is desirably amplified with an enhanced gain coinciding with the signal transitions compared to the gain when the digital signal remains in the same state.

Figure 4:
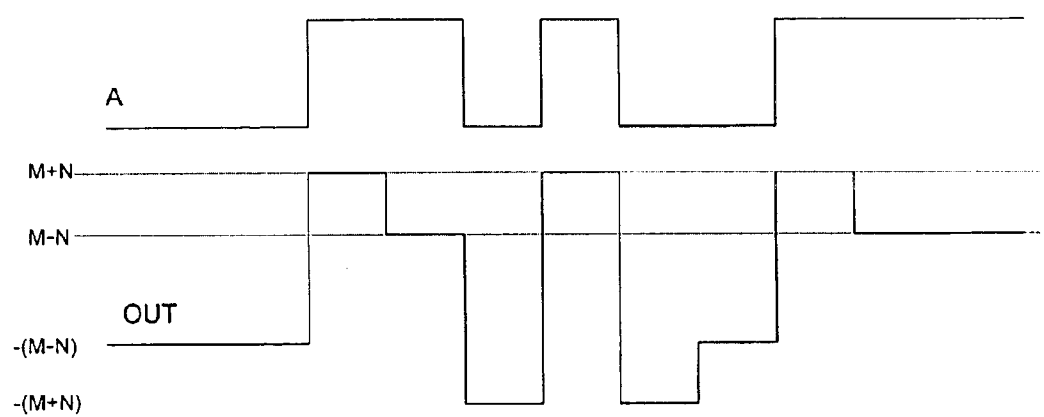
FIG. 4 shows how the signal to be transmitted and the output signal vary for illustrating the function of the circuit shown in FIG. 3.

This fact may be easily verified by observing the diagrams of FIG. 4. The digital signal A may assume either a high value (+1) or a low value (−1). One of the following situations occur:

1) when the signal A is stable to its high level +1, the output signal OUT is stable to the level M−N;
2) when the signal A is stable to its low level −1, the output signal OUT is stable to the level −(M−N);
3) when the signal A switches from its low level to the high level, the output signal OUT switches to the level M+N; and when a time equal to the introduced delay TBIT elapses without any other transition, the output signal OUT switches to the level M−N; or
4) when the signal A switches from its low level to the high level, the output signal OUT switches to the level −(M+N); and when a time equal to the introduced delay TBIT elapses without any other transition, the output signal OUT switches to the level −(M−N).

Figure 5:
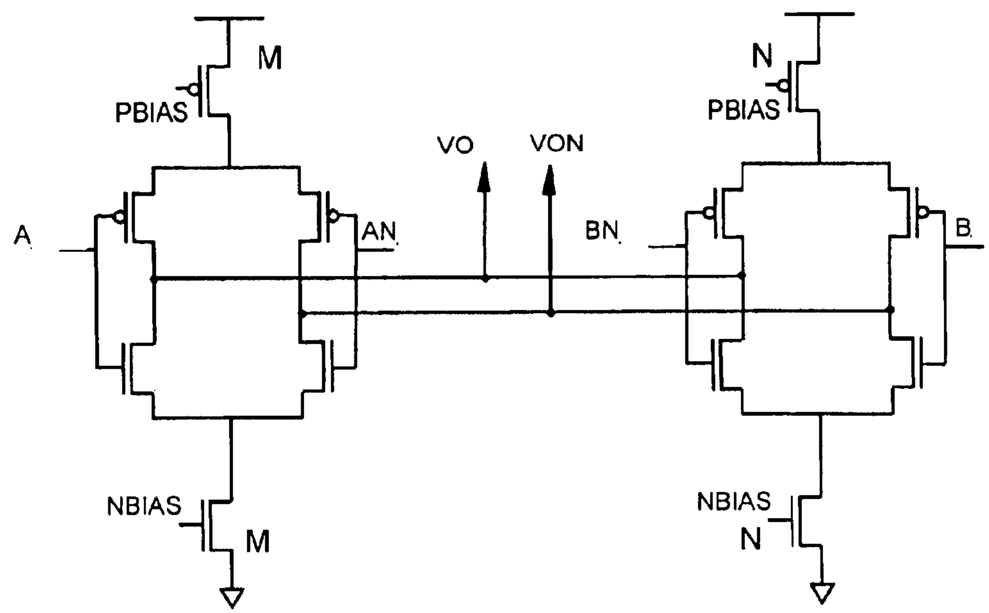
FIG. 5 depicts two standard LVDS cells of a line driver with pre-emphasis according to the present invention.

With the described circuit the desired pre-emphasis action is obtained without encountering the synchronization problems of the known line drivers with pre-emphasis, and without the undesired penalties that characterize the circuits that implement an adaptive equalization technique. According to the preferred embodiment, the amplification circuit with pre-emphasis is an LVDS driver that produces the amplified output signal OUT in the form of a differential signal pair VO, VON. A preferred embodiment of an LVDS line driver is schematically depicted in FIG. 5, wherein AN and BN respectively are the inverted replicas of the signals A and B.

Figure 1:
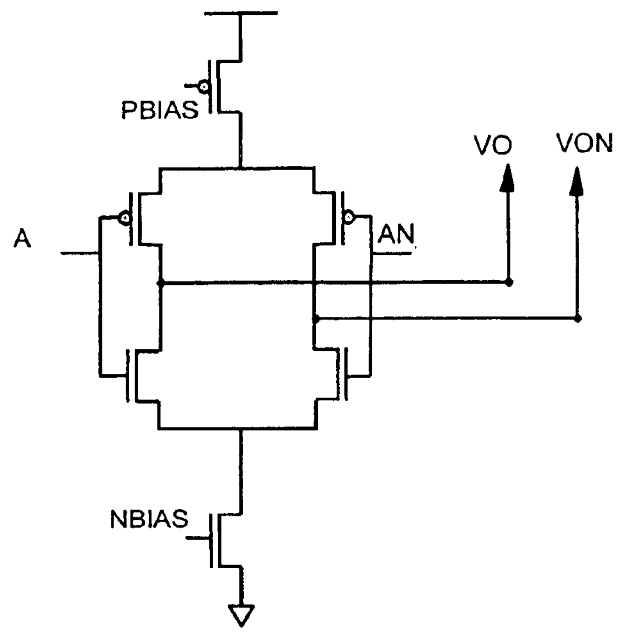
FIG. 1 depicts a standard LVDS cell according to the prior art.
Figure 2:
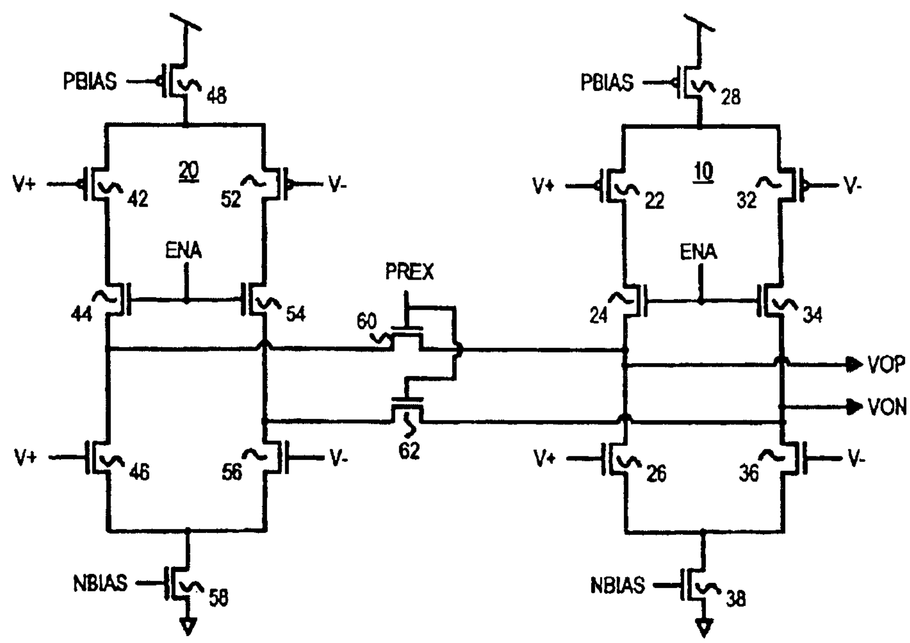
FIG. 2 depicts two standard LVDS cells of a known line driver with pre-emphasis according to the prior art.

The LVDS driver comprises two standard LVDS cells, the outputs of which are connected in common. The cell input with the signal A and its inverted replica AN is biased with a current M while the other cell, input with the signal B and its inverted replica BN, is biased with a current N smaller than M. With respect to the known circuit of FIG. 2, the LVDS driver of the invention does not use switches (60 and 62) and the two cells are fed with the signals A and B to output a differential pair of output signals VO, VON representing the difference M*A−N*B.

Figure 6:
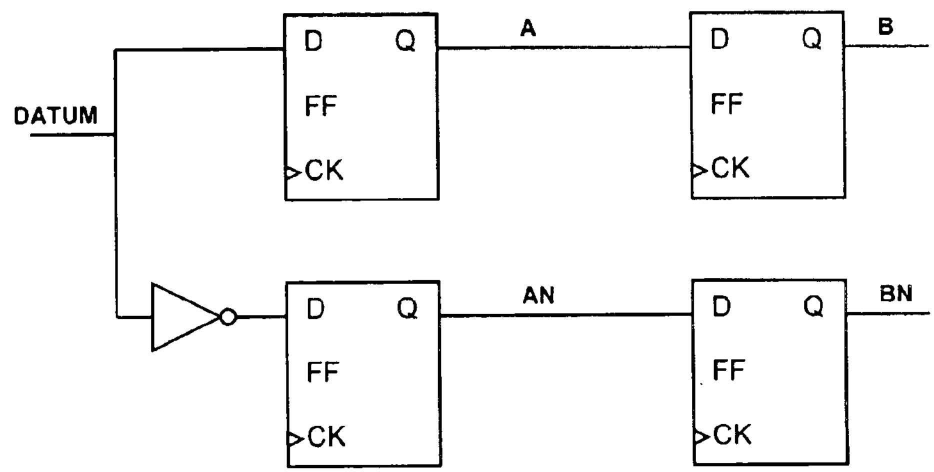
FIG. 6 depicts a preferred embodiment of a circuit for producing the amplified signal to be transmitted over a line according to the present invention.

The signals A and B and the respective inverted replicas are generated as a function of certain digital data DATUM to be transmitted over the output line, by a circuit as that shown in FIG. 6. The circuit is substantially formed by two identical input signal paths respectively input with the data DATUM and an inverted replica thereof. Each signal path includes a D-type flip-flop for generating the digital signal A and its inverted replica AN, and a delaying circuit in cascade of the first flip-flop, which by way of example, may be a second D-type flip-flop for generating the signal B and its inverted replica BN.

The pulses sent on the timing input CK of the flip-flops may be derived by a clock signal, for example, from the same clock signal used for generating the digital signal DATUM. In this way the signals AN and BN are delayed by a time corresponding to a single bit of the digital signal A.

More preferably, the flip-flops are fed at their input CK with an externally generated clock signal, the frequency of which may be a multiple of the frequency of the digital signal. In this way it is possible to delay the signals AN and BN by a time that may be even smaller that the time corresponding to a bit of the digital signal. As an alternative, the delaying circuit may even be any analog circuit capable of ensuring the introduction of a stable and precisely controllable delay.

That which is claimed is:

1. A method for amplifying with pre-emphasis a digital signal representative of data to be transmitted by a line driver over an output line, the method comprising:

receiving the digital signal via a first input signal path comprising
- a first D-type flip-flop being clocked by an externally generated timing signal, and receiving as input the digital signal and outputting the digital signal, and
- a delay circuit having a predetermined delay, and receiving as input the digital signal and outputting a delayed digital signal;

receiving an inverted digital signal via a second input signal path comprising
- a first D-type flip-flop being clocked by the externally generated timing signal, and receiving as input the inverted digital signal and outputting the inverted digital signal, and
- a delay circuit having the predetermined delay, and receiving as input the inverted digital signal and outputting a delayed inverted digital signal; and varying a gain of the line driver between an upper value to coincide with switching of the digital signal and a lower value in absence of the digital signal switching, the varying comprising
- amplifying the digital signal with a first gain for generating an amplified digital signal,
- amplifying the delayed digital signal with a second gain for generating a delayed and amplified digital signal, and
- outputting over the output line an ouput signal corresponding to a difference between the amplified digital signal and the delayed and amplified digital signal.

2. A method according to claim 1, wherein the predetermined delay is equal to duration of a bit pulse of the digital signal.

3. A method according to claim 1, wherein the predetermined delay is less than duration of a bit pulse of the digital signal.

4. A method according to claim 1, wherein the line driver further comprises first and second low voltage differential signal (LVDS) cells, with output nodes thereof being connected in common for providing the output signal as a differential pair of output signals.

5. A method according to claim 4, wherein the first LVDS cell is driven by the digital signal and by the inverted digital signal; and wherein the second LVDS cell is driven by the delayed digital signal and by the delayed inverted digital signal.

6. A method according to claim 4, wherein respective bias currents for the first and second LVDS cells is equal to a ratio between the first and second gains.

7. A method according to claim 1, wherein the externally generated timing signal comprises a clock signal that generates the digital signal.

8. A method according to claim 1, wherein a frequency of the externally generated timing signal is a multiple of a frequency of a clock signal that generates the digital signal.

9. An amplification circuit for amplifying a digital signal representative of data to be transmitted over an output line, the amplification circuit comprising:

- a driver with pre-emphasis having a gain that varies between an upper value to coincide with switching of the digital signal and a lower value in absence of the digital signal switching, said driver comprising
  - a first input signal path for receiving the digital signal and comprising
    - a first D-type flip-flop being clocked by an externally generated timing signal, and receiving as input the digital signal and outputting the digital signal, and
    - a delay circuit having a predetermined delay, and receiving as input the digital signal and outputting a delayed digital signal,
  - a second input signal path for receiving an inverted digital signal and comprising
    - a first D-type flip-flop being clocked by the externally generated timing signal, and receiving as input the inverted digital signal and outputting the inverted digital signal, and
    - a delay circuit having the predetermined delay, and receiving as input the inverted digital signal and outputting a delayed inverted digital signal, and
  - an output circuit for receiving the delayed digital signal amplified with a first gain and for receiving the delayed inverted digital signal amplified with a second gain, said output circuit for providing an output signal over the output line by determining a difference between the amplified delayed digital signal and the delayed and amplified inverted digital signal.

10. An amplification circuit according to claim 9, wherein said driver comprises first and second low voltage differential signal (LVDS) cells, with output nodes thereof being connected in common for providing the output signal as a differential pair of output signals.

11. An amplification circuit according to claim 10, wherein said first LVDS cell is driven by the digital signal and by the inverted digital signal; and wherein said second LVDS cell is driven by the delayed digital signal and by the delayed inverted digital signal.

12. An amplification circuit according to claim 11, wherein respective bias currents for said first and second LVDS cells is equal to a ratio between the first and second gains.

13. An amplification circuit according to claim 9, wherein said delay circuit in each input signal path comprises a second D-type flip-flop connected in cascade to said first D-type flip-flop.

14. An amplification circuit according to claim 9, wherein the externally generated timing signal comprises a clock signal that generates the digital signal.

15. An amplification circuit according to claim 9, wherein a frequency of the externally generated timing signal is a multiple of a frequency of a clock signal that generates the digital signal.

16. An amplification circuit for amplifying a digital signal representative of data to be transmitted over an output line, the amplification circuit comprising:

- a driver with pre-emphasis having a gain that varies between an upper value to coincide with switching of the digital signal and a lower value in absence of the digital signal switching, said driver comprising
  - a first input signal path for receiving the digital signal and comprising
    - a first D-type flip-flop being clocked by an externally generated timing signal, and receiving as input the digital signal and outputting the digital signal, and
    - a delay circuit having a predetermined delay, and receiving as input the digital signal and outputting a delayed digital signal,
  - a second input signal path for receiving an inverted digital signal and comprising
    - a first D-type flip-flop being clocked by the externally generated timing signal, and receiving as input the inverted digital signal and outputting the inverted digital signal, and
    - a delay circuit having the predetermined delay, and receiving as input the inverted digital signal and outputting a delayed inverted digital signal,
  - a first low voltage differential signal (LVDS) cell being driven by the delayed digital signal and by the delayed inverted digital signal, and
  - a second low voltage differential signal (LVDS) cell being driven by the delayed digital signal and by the delayed inverted digital signal,
  - said first and second LVDS cells being connected together so that output nodes thereof are connected in common for providing an output signal over the output line by determining a difference between an amplified digital signal and a delayed and amplified digital signal.

17. An amplification circuit according to claim 16, wherein the amplified digital signal has been amplified with a first gain, and wherein the delayed and amplified digital signal has been amplified with a second gain.

18. An amplification circuit according to claim 17, wherein respective bias currents for said first and second LVDS cells is equal to a ratio between the first and second gains.

19. An amplification circuit according to claim 16, wherein the output nodes are connected together so that the output signal comprises a differential pair of output signals.

20. An amplification circuit according to claim 16, wherein said delay circuit in each input signal path comprises a second D-type flip-flop connected in cascade to said first D-type flip-flop.

21. An amplification circuit according to claim 16, wherein the externally generated timing signal comprises a clock signal that generates the digital signal.

22. An amplification circuit according to claim 16, wherein a frequency of the externally generated timing signal is a multiple of a frequency of a clock signal that generates the digital signal.

* * * * *